United States Patent
Liebmann et al.

(10) Patent No.: US 7,229,722 B2
(45) Date of Patent: Jun. 12, 2007

(54) ALTERNATING PHASE SHIFT MASK DESIGN FOR HIGH PERFORMANCE CIRCUITRY

(75) Inventors: Lars W. Liebmann, Poughquag, NY (US); Zachary Baum, Gardiner, NY (US)

(73) Assignee: International Business Machines Corporation, Armonk, NY (US)

( * ) Notice: Subject to any disclaimer, the term of this patent is extended or adjusted under 35 U.S.C. 154(b) by 549 days.

(21) Appl. No.: 10/707,962

(22) Filed: Jan. 28, 2004

(65) Prior Publication Data

US 2005/0166175 A1    Jul. 28, 2005

(51) Int. Cl.
*G03F 1/00* (2006.01)
*G03C 5/00* (2006.01)

(52) U.S. Cl. ............................ 430/5; 430/311
(58) Field of Classification Search ................ 430/5, 430/30, 394, 311–313; 716/19–21
See application file for complete search history.

(56) References Cited

U.S. PATENT DOCUMENTS

| | | |
|---|---|---|
| 5,537,648 A | 7/1996 | Liebmann et al. |
| 5,636,131 A | 6/1997 | Liebmann et al. |
| 5,858,580 A | 1/1999 | Wang et al. |
| 5,883,813 A | 3/1999 | Kim et al. |
| 6,057,063 A | 5/2000 | Liebmann et al. |
| 6,338,922 B1 | 1/2002 | Liebmann et al. |
| 6,492,073 B1 * | 12/2002 | Lin et al. ............ 430/5 |
| 6,582,858 B2 | 6/2003 | Lai et al. |
| 6,811,954 B1 * | 11/2004 | Fukuda ............ 430/311 |
| 6,944,844 B2 * | 9/2005 | Liu ............ 716/19 |
| 2003/0093766 A1 | 5/2003 | Liebmann et al. |
| 2003/0101430 A1 | 5/2003 | Liebmann et al. |
| 2003/0162102 A1 | 8/2003 | Pierrat |

OTHER PUBLICATIONS

*Exposing the DUV SCAAM—75nm Imaging on the Cheap!*; M. D. Levenson, T. Ebihara, SPIE vol. 4692 (2002) pp. 288-297.

* cited by examiner

*Primary Examiner*—S. Rosasco
(74) *Attorney, Agent, or Firm*—DeLio & Peterson, LLC; Peter W. Peterson; Todd M. C. Li

(57) ABSTRACT

A method of designing an alternating phase shifting mask for projecting an image of an integrated circuit design having a plurality of essentially parallel segments of critical width comprises creating essentially parallel alternating phase shifting regions aligned with the critical width segments and extending beyond ends of at least some of the critical width segments, enclosing the integrated circuit layout and the alternating phase shifting regions within a boundary, extending the alternating phase shifting regions to an edge of the boundary, and thereafter creating an alternating phase shifting mask based on the alternating phase shifting regions.

34 Claims, 7 Drawing Sheets

ALTERNATING PHASE SHIFT MASK DESIGN FOR HIGH PERFORMANCE CIRCUITRY

BACKGROUND OF INVENTION

The present invention is directed to the manufacture of masks used in the lithographic production of integrated circuits and, in particular, to the manufacture of phase shifting masks (PSMs).

As an alternative to chrome on glass (COG) masks used in the lithographic production of integrated circuits, alternating phase shifting masks (altPSMs) have been employed in order to increase the resolution of the critical active area patterns projected. Such increased resolution enables smaller line widths to be exposed on the resist and consequently etched into or deposited on the wafer substrate. This is done by manipulating the electric field vector or phase of the energy beam, e.g., visible or ultra-violet light, used in the lithographic process. This phase variation is achieved in PSMs by modifying the length that a light beam travels through the mask material. By recessing the mask to an appropriate depth, light traversing the thinner portion of the mask and light traversing the thicker portion of the masks will be 180° out of phase, that is, their electric field vector will be of equal magnitude, but point in exactly the opposite direction, so that any interaction between these light beams results in perfect cancellation. However, since the recessed regions on the mask have to form closed polygons and not all edges of these polygons can be made to coincide with desired layout images, the light intensity decrease caused by these residual 180° phase steps leads to unwanted patterns on the wafer. These unwanted residual phase images are erased using a second exposure, commonly using a non-phase shifted mask.

An electronic design automation (EDA) tool converts circuit designs to altPSM layouts with minimal impact to layout design density or design complexity. One method of optimizing design of altPSMs is described in U.S. Pat. No. 6,338,922, the disclosure of which is incorporated herein by reference. Other altPSM design solutions are disclosed in U.S. Pat. Nos. 5,636,131, 5,537,648, 5,858,580 and 6,057,063. However, these approaches do not take full advantage of the introduction of gridded layouts for integrated circuit designs to optimize altPSM design sign efficiency and accuracy, and to improve lithographic performance of the resulting mask.

SUMMARY OF INVENTION

Bearing in mind the problems and deficiencies of the prior art, it is therefore an object of the present invention to provide an improved method for designing phase shifting masks for lithographic production of integrated circuits, particularly altPSMs.

It is another object of the present invention to provide a method of designing altPSMs that is particularly useful for gridded layouts of integrated circuit designs.

A further object of the invention is to provide a method of designing altPSMs that minimizes proximity effects and last array line effects in the translation of the integrated circuit design to the altPSM.

Still other objects and advantages of the invention will in part be obvious and will in part be apparent from the specification.

The above and other objects, which will be apparent to those skilled in art, are achieved in the present invention which is directed to a method of designing an alternating phase shifting mask for projecting an image of an integrated circuit design in which there is initially provided a design of an integrated circuit layout having a plurality of essentially parallel segments of critical width. The method then includes creating essentially parallel alternating phase shifting regions aligned with the critical width segments and extending beyond ends of at least some of the critical width segments, and thereafter creating an alternating phase shifting mask based on the alternating phase shifting regions.

The method preferably includes enclosing the integrated circuit layout and the alternating phase shifting regions within a boundary, and extending the alternating phase shifting regions to an edge of the boundary.

In another aspect, the present invention is directed to a method of designing an alternating phase shifting mask for projecting an image of an integrated circuit design in which there is initially provided a design of an integrated circuit layout having a plurality of essentially parallel segments of critical width. The method then includes enclosing the integrated circuit layout within a boundary, extending lengths of the critical width segments in the layout, and designating alternating phase shifting regions between the extended critical width segments. An alternating phase shifting mask is then fabricated based on the designated alternating phase shifting regions.

Normally, centerline spacing of the plurality of critical width segments and the alternating phase shifting regions is an integer multiple of a minimum pitch. The method preferably includes extending to an edge of the boundary the lengths of the critical width segments in the layout, adding additional parallel lengths of critical width segments to the design of the integrated circuit layout on at least one side of the plurality of critical width parallel segments, and designating alternating phase shifting regions between the additional critical width segments.

Where at least two of the critical width segments are co-linear, the method preferably further includes adding an additional length of critical width segments to connect the co-linear critical width segments. Where the design of the integrated circuit layout includes regions of non-critical width, the method preferably further includes removing from the designated alternating phase shifting regions the regions of non-critical width before creating the alternating phase shifting mask. More preferably, the method further includes creating a secondary trim mask for the alternating phase shifting mask, with the trim mask having opaque mask regions corresponding to the extended portions of the critical width segments.

In a further aspect, the present invention is directed to a program storage device readable by a machine, tangibly embodying a program of instructions executable by the machine to perform the aforementioned method steps for designing an alternating phase shifting mask, wherein the alternating phase shifting mask to be used to project an image of an integrated circuit design.

In yet another aspect, the present invention is directed to an article of manufacture comprising a computer-usable medium having computer readable program code means embodied therein for designing an alternating phase shifting mask, where the alternating phase shifting mask is to be used to project an image of an integrated circuit design, and comprising computer readable program code means for performing the aforementioned method steps.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

In describing the preferred embodiment of the present invention, reference will be made herein to FIGS. 1–14 of the drawings in which like numerals refer to like features of the invention.

In order to obtain additional benefit from the gridded nature of the integrated circuit layouts, wherein parallel lines are spaced at integer multiples of a fixed pitch, the present invention produces a highly simplified phase grating based on the generated grid in the absence of complex layout features. The altPSM design is obtained by aligning a grid of phase transitions to critical features of an integrated circuit design. The phase transition shapes are drawn based on a highly stylized representation of the original critical width circuit grid design, instead of forcing the circuit layout into a universal mask grid, as in the prior art. The design adapts to a local coarse grid with potentially multiple grids on the same mask. In particular, the method of designing altPSMs forms a one-dimensional grid extending around the primary circuit layout shapes, creates a highly simplified phase grating design based on the generated grid in the absence of the complex layout features, and creates phase and trim mask shapes from the simplified phase grating through simple Boolean operations, without tedious phase-shape cleanup.

Figure 1:
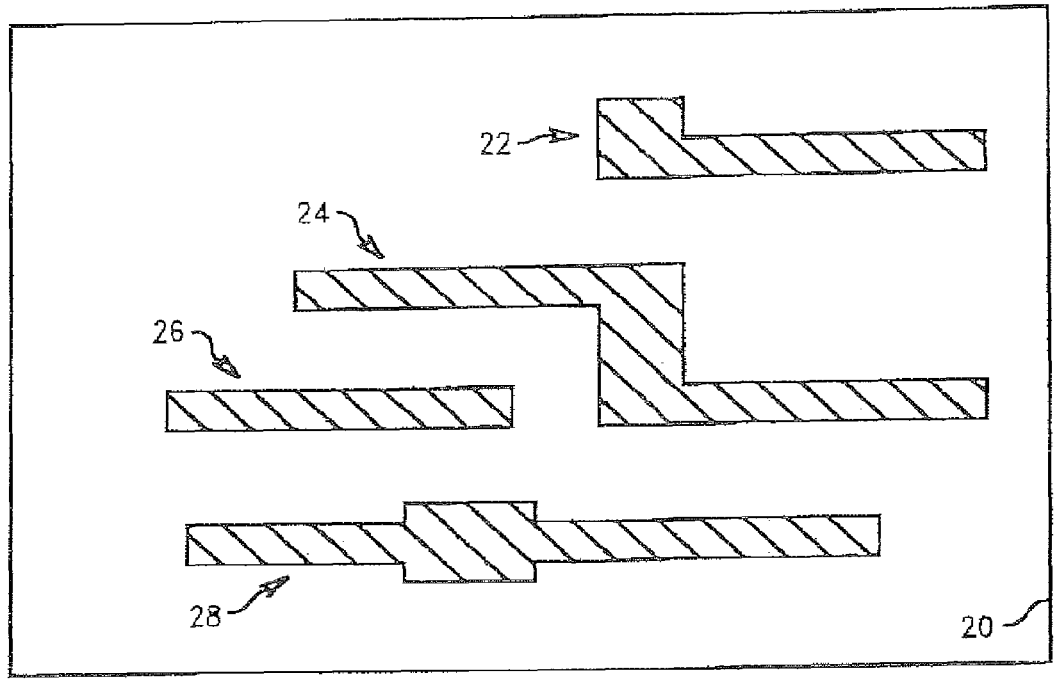
FIG. 1 is a top plan view of the integrated circuit design segments, in a gridded layout, for which an alternating phase shifting mask (altPSM) is to be fabricated.
Figure 2:
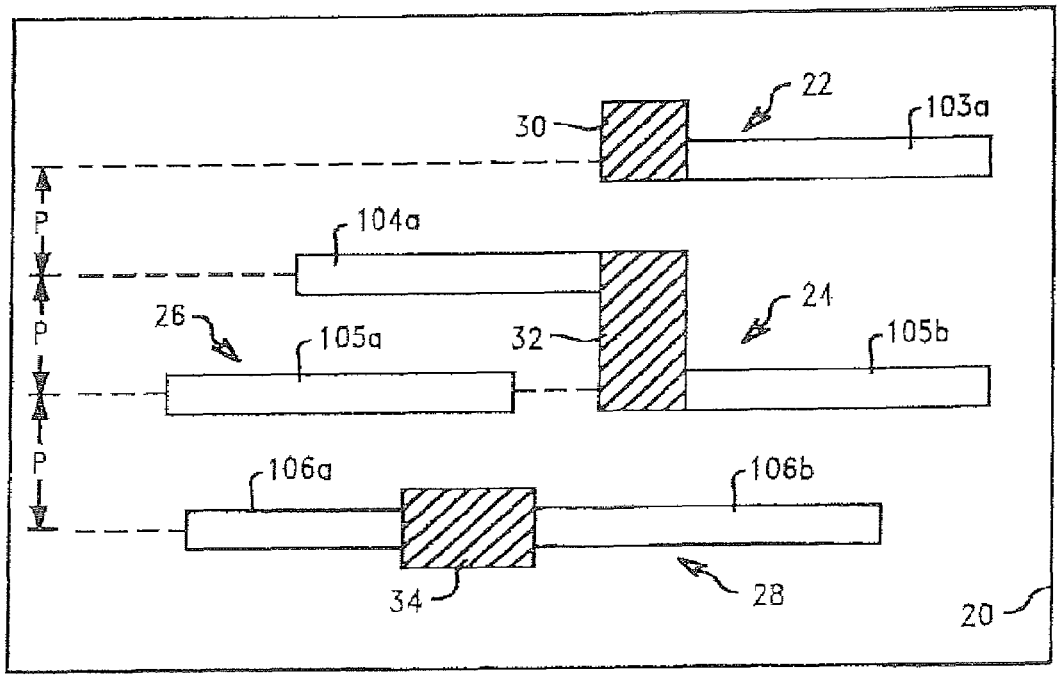
FIG. 2 is a top plan view showing the identification and differentiation of critical and non-critical shapes in the integrated circuit design of FIG. 1.

In FIG. 1, there is depicted an exemplary portion of an integrated circuit layout design comprising segments 22, 24, 26 and 28, which can be lines, holes or other shapes that need to be projected by a mask to expose and developing the design onto a resist layer. For ease of manipulation, these integrated circuit segments are placed within a rectangular cell boundary 20 during the design phase. As shown in FIG. 2, each of the integrated circuit segments is separated into critical and non critical portions. As used herein, the term critical portion refers to segments, or portions thereof, that have a critical dimension, i.e., any dimension smaller than the smallest dimension that can be printed within a specified tolerance by a lithographic process without the need for a resolution enhancement technique such as alternating phase shift mask lithography. Integrated circuit segment 22 it is made up of a critical line segment 103a and a non-critical shape segment 30; integrated circuit segment 24 is made up of critical line segments 104a and 105b connected by non-critical shape 32; integrated circuit segment 26 comprises only critical line segment 105a (which is co-linear width critical line segment 105b); and integrated circuit segment 28 is made up of co-linear critical line segments 106a and 106b, connected by non-critical shape 34. These critical line segments of the integrated circuit design have a critical width along their lengths, are all parallel and have center line spacings which are an integer multiple of a fixed pitch p.

Figure 3:
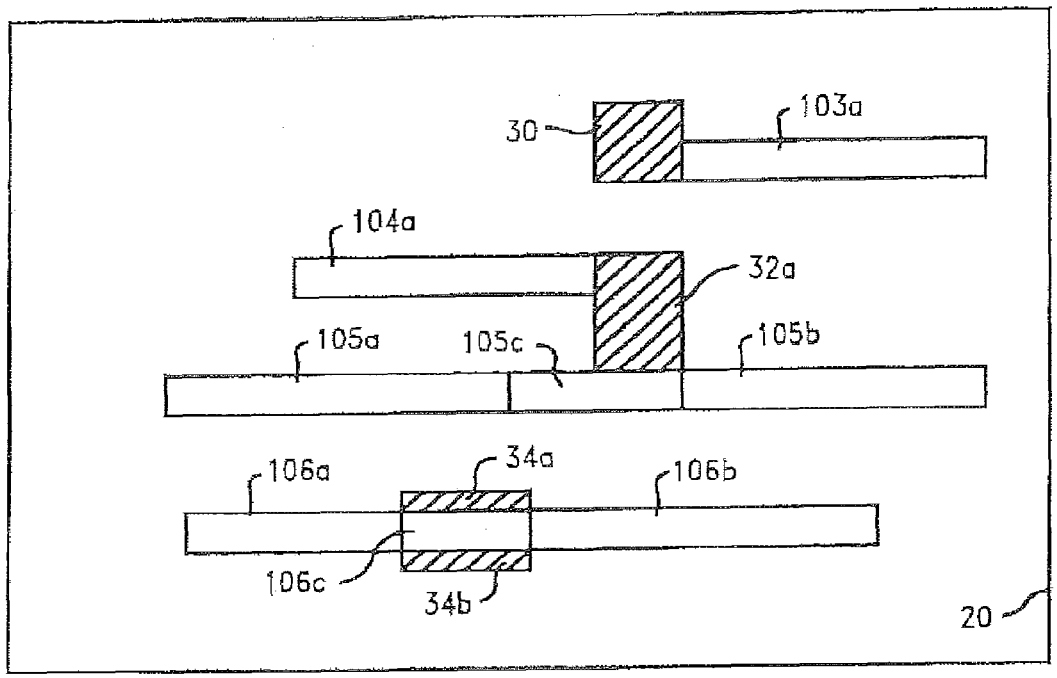
FIG. 3 is a top plan view showing the merging of critical line segments in the integrated circuit design of FIG. 1.
Figure 4:
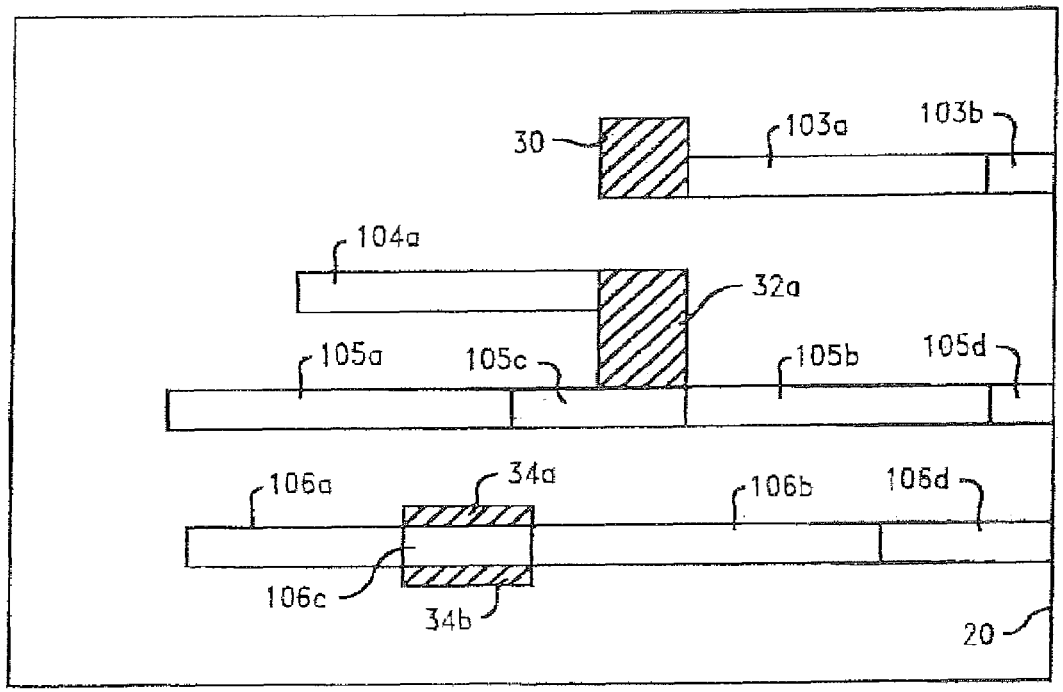
FIG. 4 is a top plan view showing the extension to the cell boundary of critical line segments of FIG. 3.

Once the critical and non-critical portions of the layout segments are identified, the design method of the present invention extends the critical line segments that are co-linear so that they merge. In FIG. 3, a co-linear critical line segment 105c is added to extend and merge critical line segments 105a and 105b, and critical line segment 106c is added to extend and merge critical line segments 106a and 106b. In the course of merging these co-linear critical line segments, a portion of shape 32 is removed leaving remaining shape 32a, and the center portion of non-critical 34 is removed leaving portions 34a and 34b. To facilitate the creation and manipulation of the design of the alternating phase shifting mask of the present invention, optionally the critical line segments may be further extended so that they contact an edge of cell boundary 20. As shown in FIG. 4, a co-linear critical width segment 103b is added to critical line segment 103a, and co-linear critical width segments 105d and 106d are added to critical width segments 105b and 106b, respectively. These extensions to the cell boundary are preferably done only if the segments are in close proximity.

Figure 5:
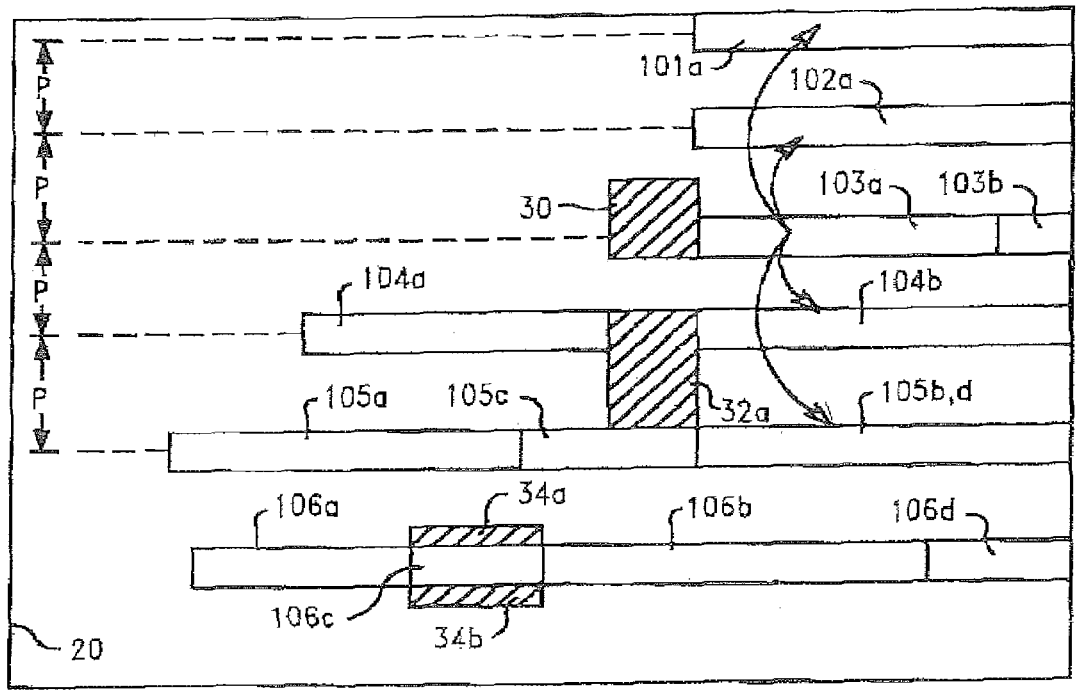
FIG. 5 is a top plan view showing the replication of the topmost critical line segment of FIG. 4 up and down by one unit pitch.
Figure 6:
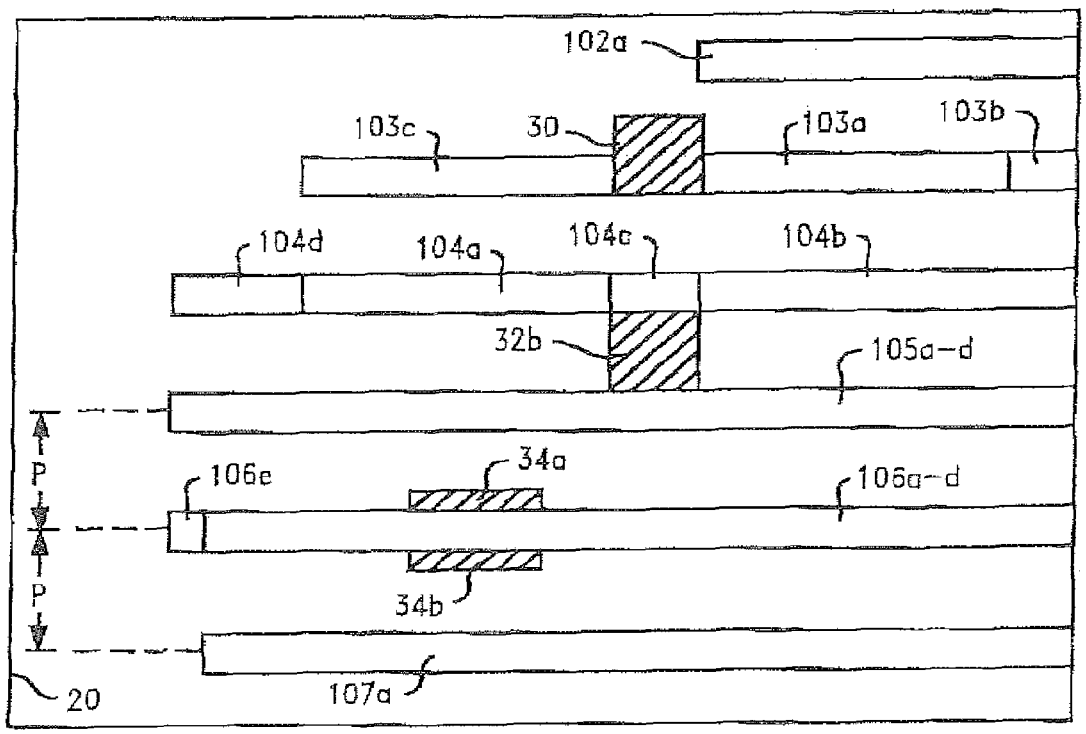
FIG. 6 is a top plan view showing the result of replication of all critical line segments of FIG. 4 up and down by one unit pitch.

The design method of the present invention also copies the designs of the upper- and lowermost critical line segments, to create parallel critical line segments of at least the same width and length above and below the segments, and at the same pitch or centerline spacing (or at an integer multiple of that pitch). In FIG. 5, there is shown at a spacing of pitch p the creation of critical line segment 102a above critical line segments 103a, 103b, and a critical line segment 104b below critical line segments 103a, 103b. Optionally, critical line segment 101a is created at two times the pitch p above critical line segment 103a, 103b. Since there is already a critical line segment at double the pitch below segment 103a, i.e. critical line segments 105b and 105d, no copying there is necessary. Similarly, as shown in FIG. 6, lowermost critical line segments 106a–d are copied at a spacing of pitch p to create critical line segment 107a equal in width and length. In this case, since critical line segments 105a–d already exist at pitch p and at least the same length above critical line segment 106a–d, no copying there is necessary.

In addition to the completion of the copying of the upper- and lowermost critical line segments, as depicted in FIG. 6 the method may also include the copying of each of the other, interior, critical line segments at a spacing of pitch p, so that each of the originally extended critical line segments has above and below it a critical line segment of at least the same length. In the case of extended line segments 104a–c, this shows adding to critical line segments 103a and b above an additional co-linear segment 103c, so that the combined length of critical line segments 103a–c equals the length of critical segments 104a–c. In the case of critical line segments 105a–d, it is necessary to add co-linear segment 104d to critical line segments 104a–c above it. Thus, as shown in FIG. 6, each of the originally extended critical line segments now have above and below it a critical line segment, separated by pitch p, of equal length and width.

Figure 7:
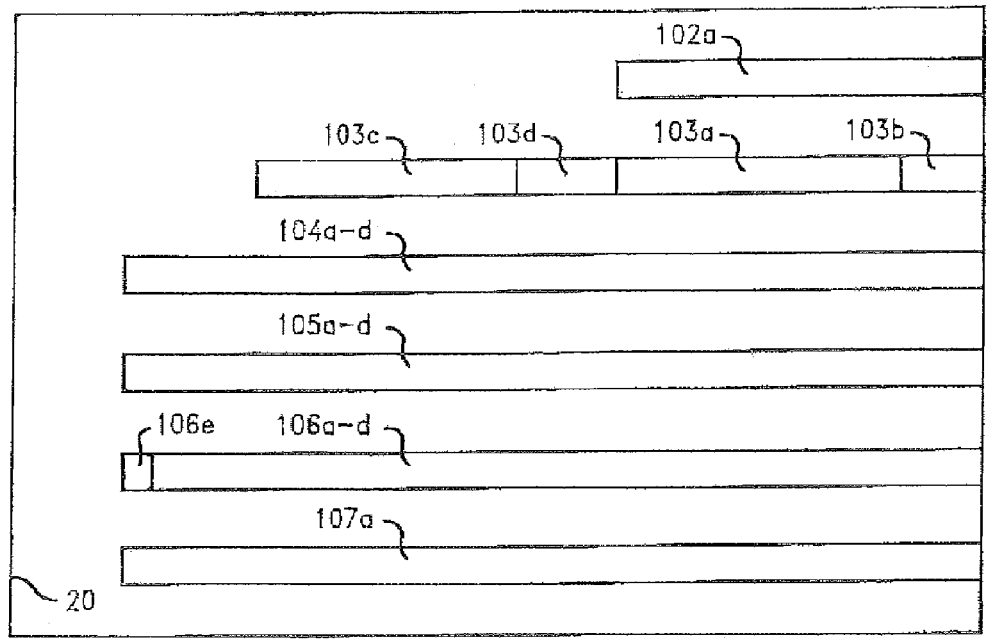
FIG. 7 is a top plan view of the combined image of all critical line segments plus their replicas above and below.
Figure 8:
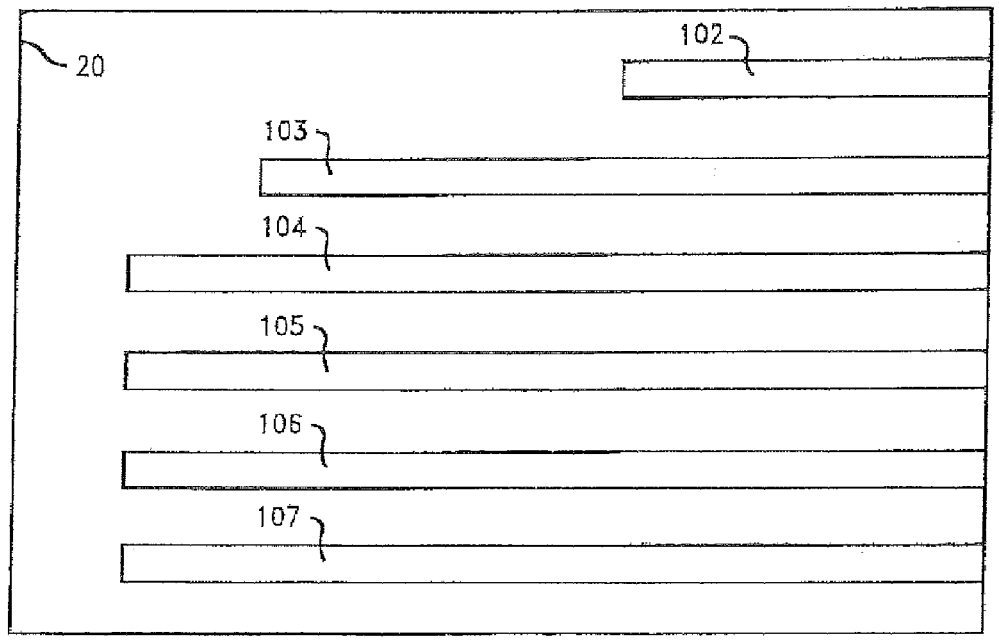
FIG. 8 is a top plan view of the phase transition grid derived from FIG. 7 by merging all the overlapping features and removing redundancy.

In FIG. 7, there is shown the removal from the mask design the remaining portions of non-critical shapes 30, 32b, 34a and 34b, so that only critical line segments remain. FIG. 7 is a top plan view of the combined image of all critical line segments plus their replicas above and below. In the case of the removal of non-critical shape 30, it is necessary to merge critical line segments 103a, b and 103c by adding a co-linear critical line segment 103d. The result shown is the combined image of all critical line segments plus their replicas above and below. By merging all the overlapping features and removing redundancy, each of the various co-linear segments are then combined into a single, integral critical line segment having the same width and combined length of the previous critical line segments, as shown in FIG. 8.

Figure 9:
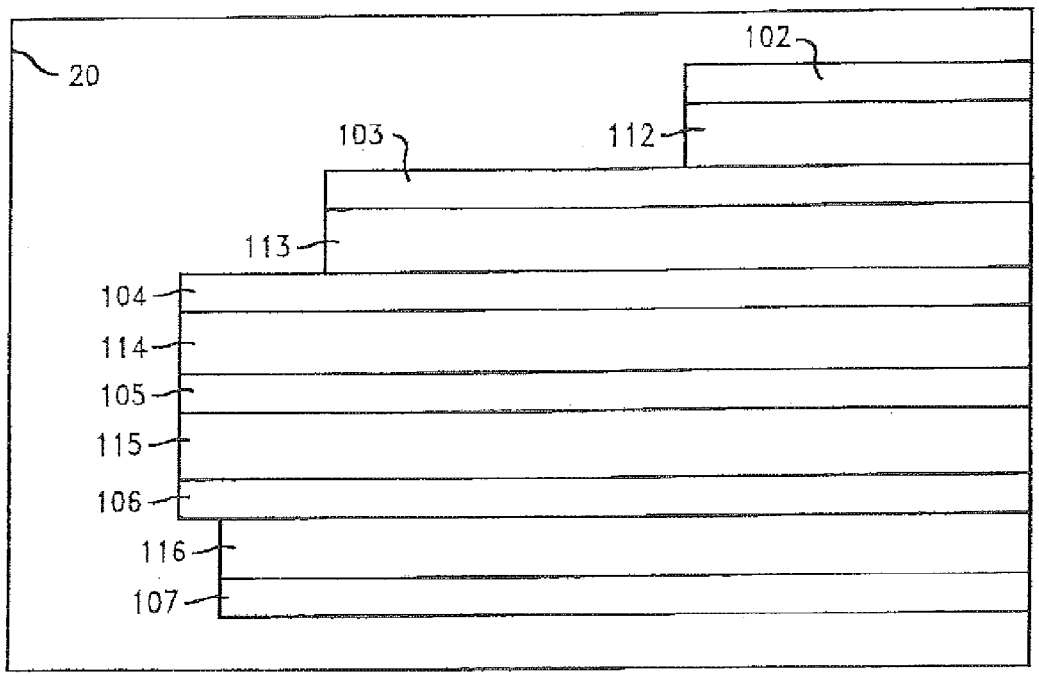
FIGS. 9 and 10 are top plan views showing the filling of the spaces between parallel critical line segments in FIG. 8 and the initial creation of designs for alternating phase shifting segments for the altPSM.

In order to design the phase shifting masks segments, basic phase regions are formed by filling the spaces between parallel critical line segments, as shown in FIG. 9. This is indicated by phase region 112 between line segments 102 and 103, phase region 113 between line segments 103 and 104, phase region 114 between line segments 104 and 105, phase region 115 between line segments 105 and 106, and phase region 116 between line segments 106 and 107. These phase regions have the length of the shorter of the combined critical line segment that they contact, and contact the right edge of boundary 20.

Figure 10:
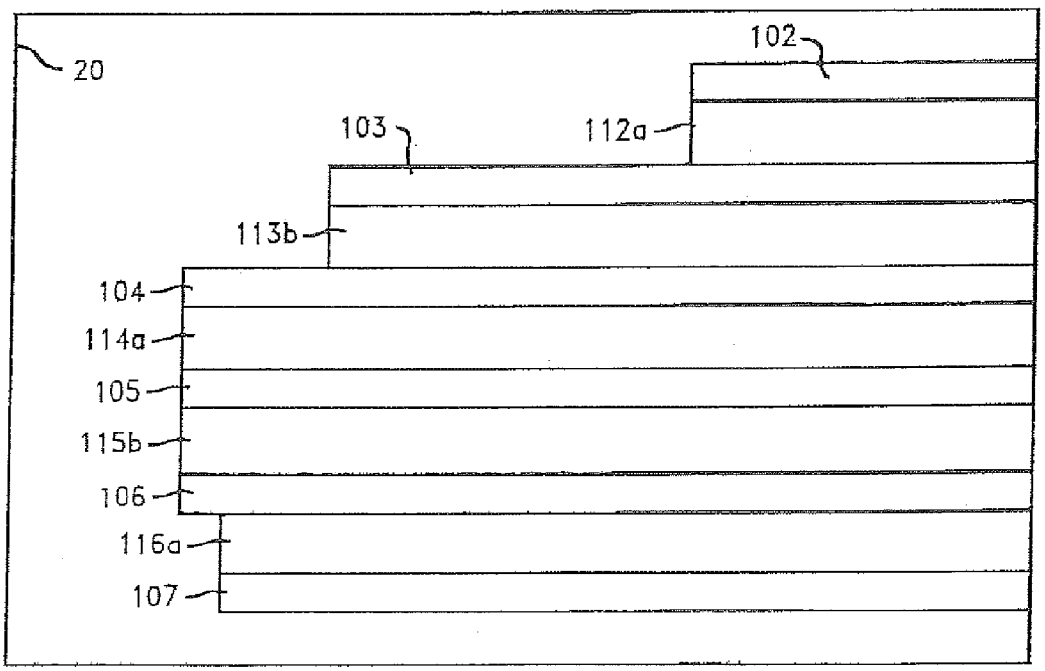

The phase regions are then converted to the desired alternating phase shifting regions to provide a 180° phase shift to the light that will pass through the finished mask. As shown in FIG. 10, these alternating phase shifting regions have the suffixes a and b to designate the 180° differential in phase shifting. This phase shifting differential may be achieved by masks which impart to the light alternately a 0° and 180° phase shift, a 90° and 270° phase shift, or any other combination that provides a 180° phase shift differential. For example, phase shifting mask segments 112a, 114a and 116a provide a 0° phase shift to the light, whereas phase shifting mask segments 113b and 115b provide a 180° phase shift. All of the phase shifting segments are separated by pitch p, identical to the pitch of the original integrated circuit critical line segments. When transmitting light in a direction normal to the drawing, the adjacent alternating phase shifting mask segments produce destructive interference of the light in the regions in which the radiation from each overlap, to produce images on the resist layer having the critical width of the original integrated circuit shape. While the width (vertical dimension) of each of the phase shifting segments is shown as being equal to the spacing between adjacent edges of the critical line segments, the width of the phase shifting mask segments may be adjusted to be either larger or smaller, depending upon the lithographic projections requirements and the mask material constraints.

Figure 11:
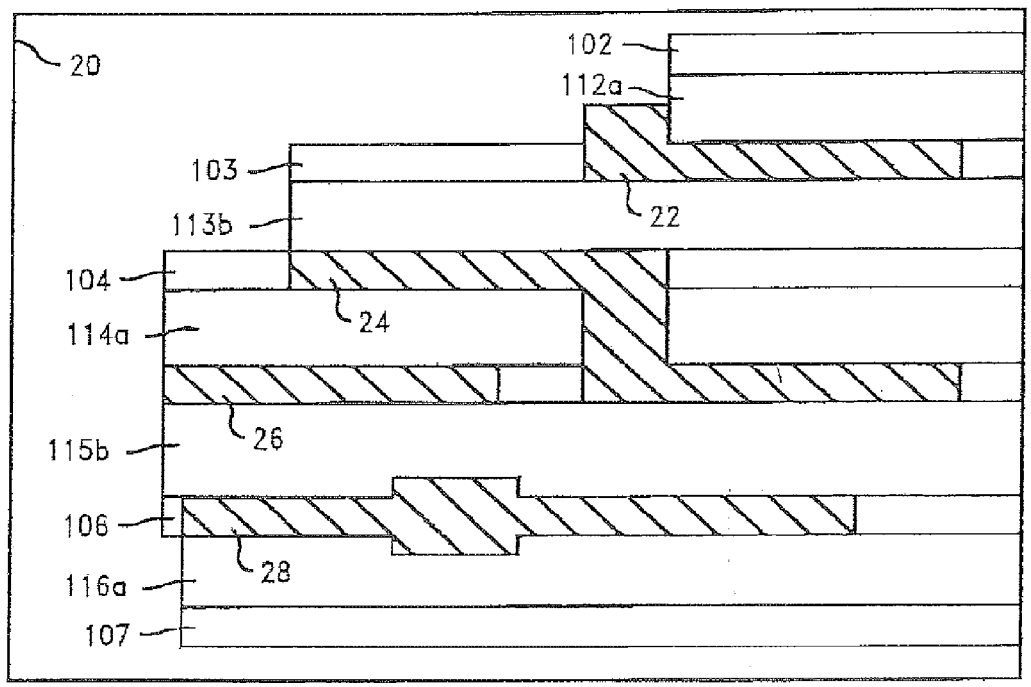
FIG. 11 is a top plan view showing the superposition of the integrated circuit design of FIG. 1 over the alternating phase shifting segments of FIG. 10.
Figure 12:
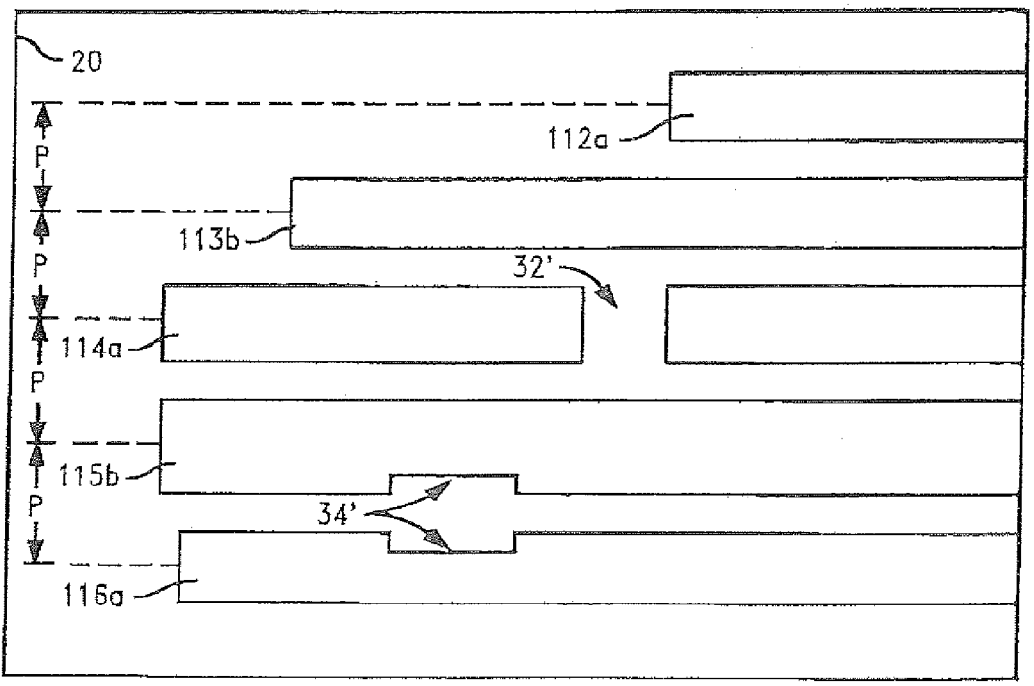
FIG. 12 is a top plan view showing the removal of the non-critical circuit shapes of FIG. 1 from the alternating phase shifting segments of FIG. 10, to form the final altPSM mask design.

In FIG. 11 there is shown the original integrated circuit shapes 22, 24, 26 and 28 overlaid over the alternating phase shifting regions of FIG. 10. These original layout shapes, along with the co-linear extensions thereof, are then subtracted from the phase shifting segment design of FIG. 10 to arrive at the final phase shifting design layout of FIG. 12. The remaining phase shifting segments themselves are the same, except that in phase shifting segment 114a, there is a space 32' corresponding to the shape of non-critical shape 32, and in phase shifting segments 115b and 116a, there are cutouts 34' corresponding to the non-critical shape 34. The design of FIG. 12 is then used to create the altPSM to be used to project the images of the critical line segments in the integrated circuit design of FIG. 1.

Figure 13:
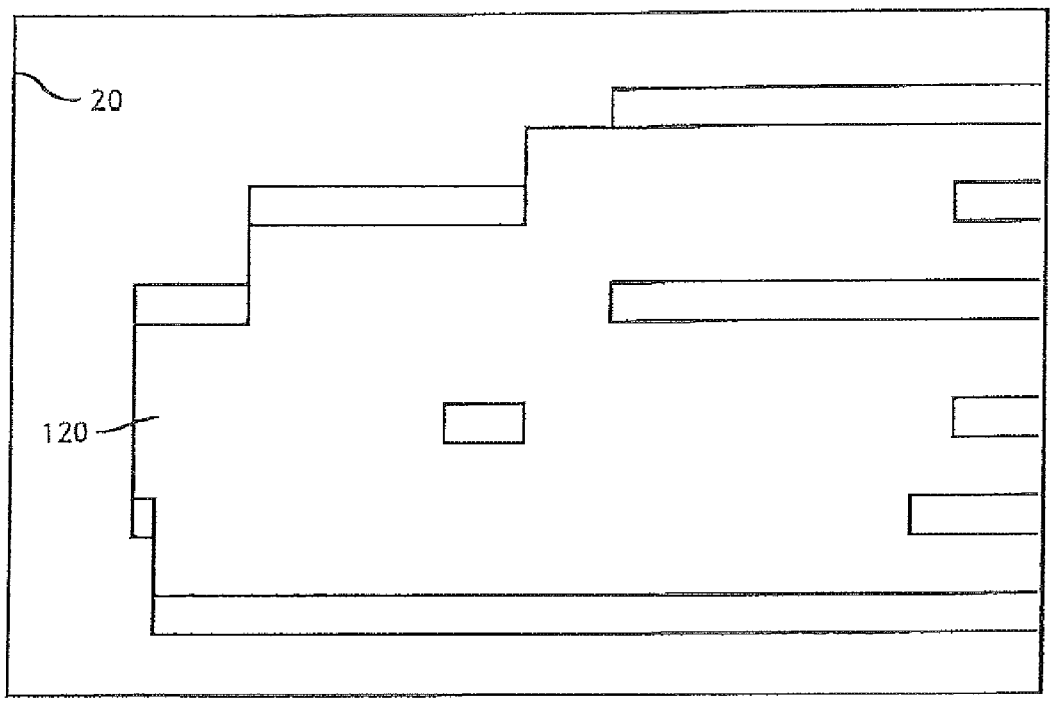
FIG. 13 is a top plan view showing the design of the secondary trim mask to be used in conjunction with the altPSM design of FIG. 12.

In order to eliminate the projection of the extension of the original critical line segments, FIG. 13 depicts the configuration of the secondary trim mask to be used in conjunction with the phase shifting mask made in accordance with the present invention. This secondary trim mask utilizes conventional opaque light-blocking segments, such as chrome on glass (COG). The blocking segments conform to the extensions made to the original critical line segments of the integrated circuit layout. The secondary trim mask has a background essentially transparent to the light used in the lithographic exposure of the resist, and has the opaque chrome regions shown by shaded regions 120 of FIG. 13. When exposed in sequence with the altPSM made according to the design of FIG. 12, the resulting resist layer image is the original integrated circuit design of FIG. 1.

Figure 14:
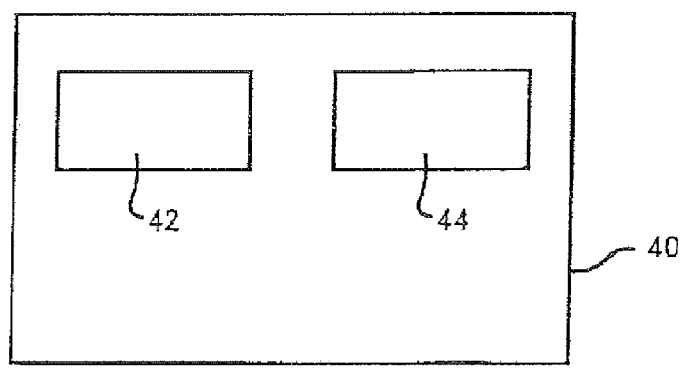
FIG. 14 is a schematic view of an EDA tool or computer containing program code for in a program storage device for executing the method of designing an altPSM in accordance with the present invention.

The method of the present invention for designing an alternating phase shifting mask may be implemented by a computer program or software incorporating the process steps and instructions described above in otherwise conventional program code and stored on an electronic design automation (EDA) tool or an otherwise conventional program storage device. As shown in FIG. 14, the program code, as well as any input information required, may be stored in EDA tool or computer 40 on program storage device 42, such as a semiconductor chip, a read-only memory, magnetic media such as a diskette or computer hard drive, or optical media such as a CD or DVD ROM. Computer system 40 has a microprocessor 44 for reading and executing the stored program code in device 42 in the manner described above.

Thus, the present invention takes full advantage of gridded layouts for integrated circuit designs to optimize altPSM design efficiency and accuracy, and to improve lithographic performance of the resulting mask by the imaging of largely one-dimensional phase gratings. The instant method of designing altPSMs minimizes both proximity effects through the use of largely one-dimensional phase shapes extending beyond the original circuit layout patterns, and eliminates last array line effects through the insertion of multiple supplementary phase transitions. The PSM design coding is optimized as a result of specialization to the gridded layouts, which require no phase clean-up. The local adaptation of the phase grating to the layout pitch allows for multiple pitches in a given technology, or on one chip layout.

Thus, having described the invention, what is claimed is:

1. A method of designing an alternating phase shifting mask for projecting an image of an integrated circuit design comprising:
    providing a design of an integrated circuit layout having a plurality of essentially parallel segments of critical width;
    creating essentially parallel alternating phase shifting regions aligned with the critical width segments and extending beyond ends of at least some of the critical width segments; and
    creating an alternating phase shifting mask based on the alternating phase shifting regions.

2. The method of claim 1 further including enclosing the integrated circuit layout and the alternating phase shifting regions within a boundary, and extending the alternating phase shifting regions to an edge of the boundary.

3. The method of claim 1 wherein centerline spacing of the plurality of critical width segments and the alternating phase shifting regions is an integer multiple of a minimum pitch.

4. The method of claim 3 further including enclosing the integrated circuit layout and the alternating phase shifting regions within a boundary, and extending the alternating phase shifting regions to an edge of the boundary.

5. A method of designing an alternating phase shifting mask for projecting an image of an integrated circuit design comprising:
    providing a design of an integrated circuit layout having a plurality of essentially parallel segments of critical width;
    enclosing the integrated circuit layout within a boundary;
    extending lengths of the critical width segments in the layout; designating alternating phase shifting regions between the extended critical width segments; and
    creating an alternating phase shifting mask based on the designated alternating phase shifting regions.

6. The method of claim 5 wherein centerline spacing of the plurality of critical width segments is an integer multiple of a minimum pitch.

7. The method of claim 5 further including extending to an edge of the boundary the lengths of the critical width segments in the layout.

8. The method of claim 5 further including adding additional parallel lengths of critical width segments to the design of the integrated circuit layout on at least one side of the plurality of critical width parallel segments, and designating alternating phase shifting regions between the additional critical width segments.

9. The method of claim 5 wherein at least two of the critical width segments are co-linear, and further including adding an additional length of critical width segments to connect the co-linear critical width segments.

10. The method of claim 5 wherein the design of the integrated circuit layout includes regions of non-critical width, and further including removing from the designated alternating phase shifting regions the regions of non-critical width before creating the alternating phase shifting mask.

11. The method of claim 5 further including creating a secondary trim mask for the alternating phase shifting mask, the trim mask having opaque mask regions corresponding to the extended portions of the critical width segments.

12. A method of designing an alternating phase shifting mask for projecting an image of an integrated circuit design comprising:
    providing a design of an integrated circuit layout having a plurality of essentially parallel segments of critical width and regions of non-critical width, the critical width segments having centerline spacing which is an integer multiple of a minimum pitch enclosing the integrated circuit layout within a boundary;
    extending lengths of the critical width segments in the layout;
    designating alternating phase shifting regions between the extended critical width segments;
    removing from the designated alternating phase shifting regions the regions of non-critical width; and
    creating an alternating phase shifting mask based on the designated alternating phase shifting regions.

13. The method of claim 12 further including extending to an edge of the boundary the lengths of the critical width segments in the layout.

14. The method of claim 12 further including adding additional parallel lengths of critical width segments to the design of the integrated circuit layout on at least one side of the plurality of critical width parallel segments, and designating alternating phase shifting regions between the additional critical width segments.

15. The method of claim 12 wherein at least two of the critical width segments are co-linear, and further including adding an additional length of critical width segments to connect the co-linear critical width segments.

16. The method of claim 12 further including creating a secondary trim mask for the alternating phase shifting mask, the trim mask having opaque mask regions corresponding to the extended portions of the critical width segments.

17. A program storage device readable by a machine, tangibly embodying a program of instructions executable by the machine to perform method steps for designing an alternating phase shifting mask, the alternating phase shifting mask to be used to project an image of an integrated circuit design, said method steps comprising:
    providing a design of an integrated circuit layout having a plurality of essentially parallel segments of critical width; and
    creating essentially parallel alternating phase shifting regions aligned with the critical width segments and extending beyond ends of at least some of the critical width segments.

18. The program storage device of claim 17 wherein the method further includes enclosing the integrated circuit layout and the alternating phase shifting regions within a boundary, and extending the alternating phase shifting regions to an edge of the boundary.

19. The program storage device of claim 17 wherein centerline spacing of the plurality of critical width segments and the alternating phase shifting regions is an integer multiple of a minimum pitch.

20. A program storage device readable by a machine, tangibly embodying a program of instructions executable by the machine to perform method steps for designing an alternating phase shifting mask, the alternating phase shifting mask to be used to project an image of an integrated circuit design, said method steps comprising:

enclosing within a boundary a design of an integrated circuit layout having a plurality of essentially parallel segments of critical width;

extending lengths of the critical width segments in the layout; and designating alternating phase shifting regions between the extended critical width segments in the alternating phase shifting mask.

21. The program storage device of claim 20 wherein centerline spacing of the plurality of critical width segments is an integer multiple of a minimum pitch.

22. The program storage device of claim 20 wherein the method further includes extending to an edge of the boundary the lengths of the critical width segments in the layout.

23. The program storage device of claim 20 wherein the method further includes adding additional parallel lengths of critical width segments to the design of the integrated circuit layout on at least one side of the plurality of critical width parallel segments, and designating alternating phase shifting regions between the additional critical width segments.

24. The program storage device of claim 20 wherein at least two of the critical width segments are co-linear, and wherein the method further includes adding an additional length of critical width segments to connect the co-linear critical width segments.

25. The program storage device of claim 20 wherein the design of the integrated circuit layout includes regions of non-critical width, and wherein the method further includes removing from the designated alternating phase shifting regions the regions of non-critical width.

26. An article of manufacture comprising a computer-usable medium having computer readable program code means embodied therein for designing an alternating phase shifting mask, the alternating phase shifting mask to be used to project an image of an integrated circuit design, the computer readable program code means in said article of manufacture comprising:

computer readable program code means providing a design of an integrated circuit layout having a plurality of essentially parallel segments of critical width; and computer readable program code means for creating essentially parallel alternating phase shifting regions aligned with the critical width segments and extending beyond ends of at least some of the critical width segments.

27. The article of claim 26 wherein the computer readable program code means further includes computer readable program code means enclosing the integrated circuit layout and the alternating phase shifting regions within a boundary, and extending the alternating phase shifting regions to an edge of the boundary.

28. The article of claim 26 wherein centerline spacing of the plurality of critical width segments and the alternating phase shifting regions is an integer multiple of a minimum pitch.

29. An article of manufacture comprising a computer-usable medium having computer readable program code means embodied therein for designing an alternating phase shifting mask, the alternating phase shifting mask to be used to project an image of an integrated circuit design, the computer readable program code means in said article of manufacture comprising:

computer readable program code means for enclosing within a boundary a design of an integrated circuit layout having a plurality of essentially parallel segments of critical width;

computer readable program code means for extending lengths of the critical width segments in the layout; and computer readable program code means for designating alternating phase shifting regions between the extended critical width segments in the alternating phase shifting mask.

30. The article of claim 29 wherein centerline spacing of the plurality of critical width segments is an integer multiple of a minimum pitch.

31. The article of claim 29 wherein the computer readable program code means further includes computer readable program code means for extending to an edge of the boundary the lengths of the critical width segments in the layout.

32. The article of claim 29 wherein the computer readable program code means further includes computer readable program code means for adding additional parallel lengths of critical width segments to the design of the integrated circuit layout on at least one side of the plurality of critical width parallel segments, and designating alternating phase shifting regions between the additional critical width segments.

33. The article of claim 29 wherein at least two of the critical width segments are co-linear, and wherein the computer readable program code means further includes computer readable program code means for adding an additional length of critical width segments to connect the co-linear critical width segments.

34. The article of claim 29 wherein the design of the integrated circuit layout includes regions of non-critical width, and wherein the computer readable program code means further includes computer readable program code means for removing from the designated alternating phase shifting regions the regions of non-critical width.

* * * * *